(12) United States Patent
Kang et al.

(10) Patent No.: US 12,520,709 B2
(45) Date of Patent: Jan. 6, 2026

(54) DISPLAY DEVICE

(71) Applicant: Samsung Display Co., LTD., Yongin-si (KR)

(72) Inventors: Donggyu Kang, Asan-si (KR); Sedong Kim, Cheonan-si (KR); Hyoungwook Song, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 734 days.

(21) Appl. No.: 17/959,117

(22) Filed: Oct. 3, 2022

(65) Prior Publication Data

US 2023/0108064 A1    Apr. 6, 2023

(30) Foreign Application Priority Data

Oct. 6, 2021 (KR) .................. 10-2021-0132737

(51) Int. Cl.
| | |
|---|---|
| *H10K 59/88* | (2023.01) |
| *H10K 59/131* | (2023.01) |
| *H10K 71/00* | (2023.01) |
| *H10K 50/844* | (2023.01) |
| *H10K 59/12* | (2023.01) |

(52) U.S. Cl.
CPC .......... *H10K 59/88* (2023.02); *H10K 59/131* (2023.02); *H10K 71/00* (2023.02); *H10K 50/8445* (2023.02); *H10K 59/1201* (2023.02)

(58) Field of Classification Search
CPC ...................................... H10K 59/88
See application file for complete search history.

(56) References Cited

U.S. PATENT DOCUMENTS

| | | | |
|---|---|---|---|
| 2019/0213940 A1 | 7/2019 | Veidhes et al. | |
| 2021/0257435 A1* | 8/2021 | Kim .................. | H10K 59/353 |

FOREIGN PATENT DOCUMENTS

| | | |
|---|---|---|
| KR | 10-1730164 B1 | 4/2017 |
| KR | 10-2019-0056477 A | 5/2019 |
| KR | 10-2019-0084189 A | 7/2019 |
| KR | 10-2020-0126473 A | 11/2020 |
| KR | 10-2021-0052636 A | 5/2021 |

* cited by examiner

*Primary Examiner* — Douglas M Menz
(74) *Attorney, Agent, or Firm* — Womble Bond Dickinson (US) LLP

(57) ABSTRACT

A display device includes: a transistor on a substrate in a display area; at least one monitor pattern on the substrate in a monitor area adjacent to the display area and electrically floating; and an emission layer on the transistor.

19 Claims, 16 Drawing Sheets

DISPLAY DEVICE

CROSS-REFERENCE TO RELATED APPLICATION

This application claims priority to and the benefit of Korean Patent Application No. 10-2021-0132737, filed on Oct. 6, 2021, the content of which in its entirety is herein incorporated by reference.

BACKGROUND

1. Field

Aspects of some embodiments of the present disclosure relate generally to a display device.

2. Description of the Related Art

A display device may be divided into a display area and a line area surrounding the display area. An emission layer and an encapsulation layer (e.g., an inorganic layer and an organic layer) arranged on the emission layer may be formed in the display area, and lines for driving the emission layer may be formed in the line area. Various defects may occur as part of the process of manufacturing a display device. For example, a defect in which the encapsulation layer invades the line area may occur. If the defect is not detected and corrected early in the manufacturing process, the yield of the completed display device may be reduced.

The above information disclosed in this Background section is only for enhancement of understanding of the background and therefore the information discussed in this Background section does not necessarily constitute prior art.

SUMMARY

Aspects of some embodiments include a display device in which defects can be detected relatively early in the manufacturing process.

A display device according to some embodiments may include a transistor on a substrate in a display area, at least one monitor pattern on the substrate in a monitor area adjacent to the display area and electrically floating, and an emission layer on the transistor.

According to some embodiments, the monitor pattern may be in an island shape.

According to some embodiments, the display device may further include a passivation layer under the monitor pattern, and a contact hole may not be defined in the passivation layer which contacts the monitor pattern.

According to some embodiments, the display device may further include lower structures between the monitor pattern and the passivation layer and spaced apart from each other, and a contact hole may not be defined in the lower structures which contact the monitor pattern.

According to some embodiments, the monitor pattern may contact an upper surface and a side surface of each of the lower structures.

According to some embodiments, the monitor pattern may be arranged along a profile of the passivation layer and the lower structures.

According to some embodiments, the display device may further include a via insulating layer on the transistor and including a same organic material as the lower structures and a first electrode between the via insulating layer and the emission layer, including a same material as the monitor pattern, and electrically connected to the transistor. The passivation layer may overlap the display area, and may be between the transistor and the via insulating layer.

According to some embodiments, the display device may further include upper structures on the monitor pattern and spaced apart from each other, and a contact hole may not be defined in the upper structures which overlap the monitor pattern.

According to some embodiments, the monitor pattern overlapping the upper structure may not be exposed.

According to some embodiments, the display device may further include a first inorganic layer on the monitor pattern and the upper structures, and a contact hole may not be defined in the first inorganic layer which contacts the monitor pattern.

According to some embodiments, the display device may further include a first electrode between the transistor and the emission layer, including a same material as the monitor pattern, and electrically connected to the transistor and a pixel defining layer on the first electrode and including a same organic material as the upper structures. The first inorganic layer may overlap the display area and is on the pixel defining layer.

According to some embodiments, the display device may further include a passivation layer under the monitor pattern, lower structures between the passivation layer and the monitor pattern and spaced apart from each other, upper structures on the monitor pattern and spaced apart from each other, and a first inorganic layer on the monitor pattern and the upper structures. The monitor pattern may be completely covered by the passivation layer, the lower structures, the upper structures, and the first inorganic layer.

According to some embodiments, the display device may further include an organic layer on the emission layer and the monitor pattern and overlapping the monitor pattern. The monitor area may be adjacent to the display area in a first direction and the monitor pattern may further extend from the organic layer by a first margin distance in the first direction, in a plan view.

According to some embodiments, the display device may further include a second inorganic layer on the organic layer and overlapping the monitor pattern. The monitor pattern may further extend from the second inorganic layer by a second margin distance in the first direction, in a plan view.

According to some embodiments, the first margin distance may be greater than the second margin distance.

According to some embodiments, the monitor area may be adjacent to the display area in a first direction and the monitor pattern may include a plurality of monitor patterns in a second direction intersecting the first direction.

According to some embodiments, the monitor area may include a first monitor area adjacent to the display area in a first direction and a second monitor area adjacent to the display area in a fourth direction opposite to the first direction. The monitor pattern may include first monitor patterns arranged in a second direction intersecting the first direction in the first monitor area and second monitor patterns arranged in the second direction in the second monitor area.

According to some embodiments, the display device may further include a clock line on the substrate in a line area adjacent to the monitor area, the monitor area may be adjacent to the display area in a first direction, and the line area may be adjacent to the monitor area in the first direction.

According to some embodiments, the monitor pattern may include at least one selected from a group consisting of a metal, an alloy, a conductive metal oxide, and a transparent conductive material.

Therefore, a display device according to some embodiments of the present invention may include an electrically floated monitor pattern. The monitor pattern may be between the display area and the line area, and an area overlapping the monitor pattern may be monitored using the monitor pattern. Accordingly, a defect in which the organic layer and/or the inorganic layer overlap the line area can be detected early.

It is to be understood that both the foregoing general description and the following detailed description are examples and are intended to provide further explanation of the inventive concept as claimed.

BRIEF DESCRIPTION OF THE DRAWINGS

The accompanying drawings, which are included to provide a further understanding of the inventive concept and are incorporated in and constitute a part of this specification, illustrate embodiments of the inventive concept together with the description.

DETAILED DESCRIPTION

Illustrative, non-limiting embodiments will be more clearly understood from the following detailed description in conjunction with the accompanying drawings.

Figure 1:
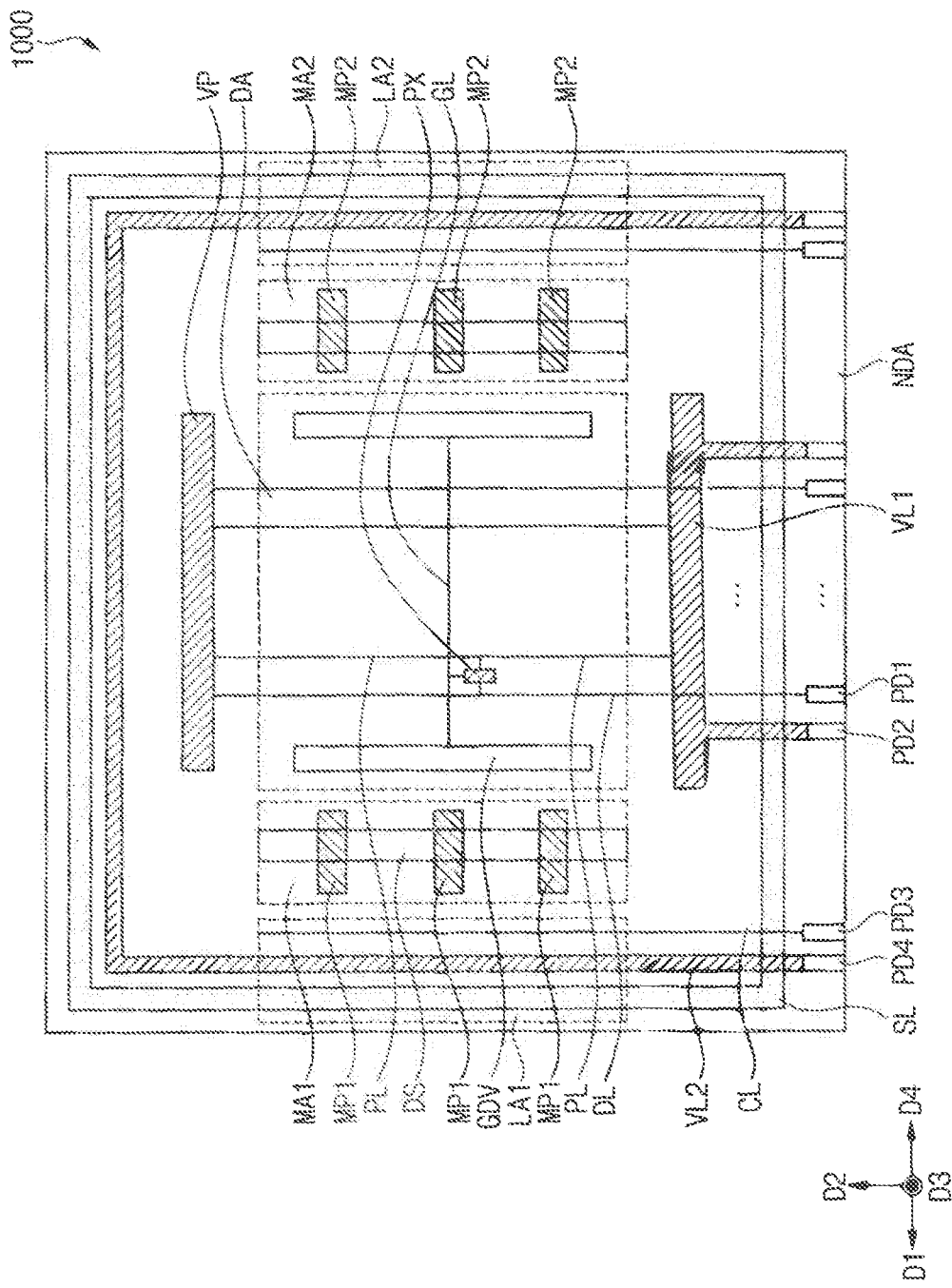
FIG. 1 is a plan view illustrating a display device according to some embodiments.

FIG. 1 is a plan view illustrating a display device according to some embodiments.

Referring to FIG. 1, a display device 1000 according to some embodiments may divided into a display area DA, a first monitor area MA1, a second monitor area MA2, a first line area LA1, a second line area LA2, and a non-display area NDA.

According to some embodiments, the display area DA may have a rectangular shape, although embodiments are not limited thereto, and the display area DA may include any suitable shape according to the design of the display device 1000.

The first monitor area MA1 may be adjacent to the display area DA in a first direction D1. The second monitor area MA2 may be adjacent to the display area DA in a fourth direction D4 opposite to the first direction D1. In other words, the display area DA may be positioned between the first monitor area MA1 and the second monitor area MA2.

The first line area LA1 may be adjacent to the first monitor area MA1 in the first direction D1. The second line area LA2 may be adjacent to the second monitor area MA2 in the fourth direction D4. In other words, the first monitor area MA1 may be positioned between the first line area LA1 and the display area DA, and the second monitor area MA2 may be arranged between the second line area LA2 and the display area DA.

The non-display area NDA may be defined as an area excluding the display area DA, the first monitor area MA1, the second monitor area MA2, the first line area LA1, and the second line area LA2.

An image may be displayed in the display area DA. According to some embodiments, at least one pixel PX and a gate driver GDV may be arranged in the display area DA.

The pixel PX may be electrically connected to a data line DL, a driving voltage line PL, and a gate line GL.

The gate driver GDV may be arranged on at least one side (e.g., left side and/or right side) of the display area DA. The gate driver GDV may receive a clock signal from a clock line CL. The gate driver GDV may generate a first gate signal (e.g., a first gate signal SC in FIG. 2) and a second gate signal (e.g., a second gate signal SS in FIG. 2) based on the clock signal. The first gate signal SC and the second gate signal SS may be provided to the pixel PX through the gate line GL.

A first pad PD1, a second pad PD2, a third pad PD3, a fourth pad PD4, a first voltage line VL1, and a driving voltage pattern VP, a clock line CL, a second voltage line VL2, and a sealing member SL may be arranged in the non-display area NDA.

According to some embodiments, the first to fourth pads PD1, PD2, PD3, and PD4 may be arranged in the non-display area NDA adjacent to the lower side of the display area DA. The first to fourth pads PD1, PD2, PD3, and PD4 may receive signals and/or voltages through a printed circuit board.

Figure 2:
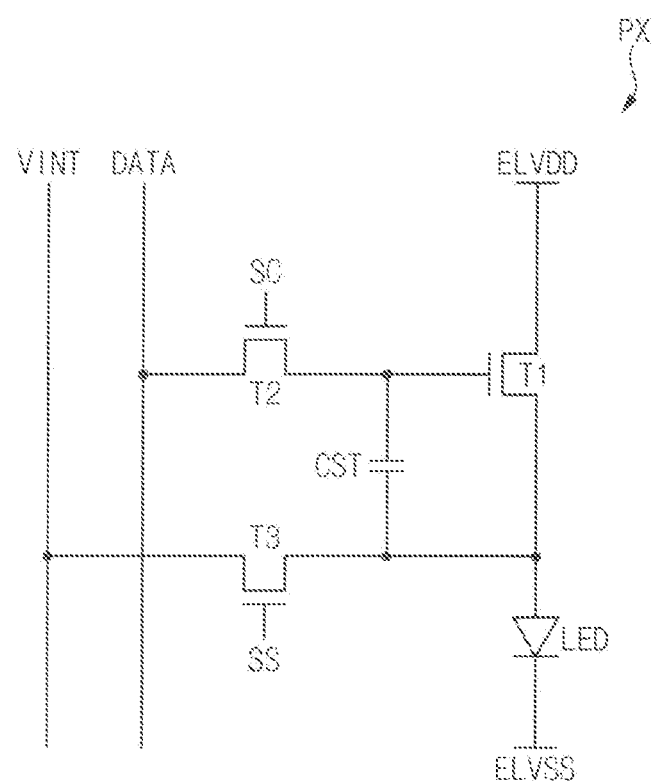
FIG. 2 is a circuit diagram illustrating a pixel included in the display device of FIG. 1.

The first pad PD1 may receive a data voltage (e.g., a data voltage DATA of FIG. 2). The data voltage DATA may be provided to the pixel PX through the data line DL.

The second pad PD2 may receive a first voltage (e.g., a first voltage ELVDD in FIG. 2). The first voltage ELVDD may be provided to the pixel PX through the first voltage line VL1 and the driving voltage line PL.

The third pad PD3 may receive the clock signal. The clock signal may be provided to the gate driver GDV through the clock line CL.

The fourth pad PD4 may receive a second voltage (e.g., a second voltage ELVSS in FIG. 2). The second voltage ELVSS may be provided to the pixel PX through a second electrode (e.g., a second electrode CTE in FIG. 3).

According to some embodiments, the driving voltage pattern VP may be arranged in the non-display area NDA adjacent to an upper side of the display area DA. The driving voltage pattern VP may be connected to the driving voltage line PL, and may prevent or reduce a voltage drop of the first voltage ELVDD.

The clock line CL may extend from the third pad PD3 in a second direction D2 intersecting the first direction D1. In addition, the clock line CL may overlap the first line area LA1.

The second voltage line VL2 may be arranged to surround the display area DA, the first monitor area MA1, and the second monitor area MA2. In addition, the second voltage line VL2 may overlap the first line area LA1 and may be adjacent to the clock line CL in the first direction D1.

The sealing member SL may be arranged to surround the display area DA, the first monitor area MA1, and the second monitor area MA2. According to some embodiments, the sealing member SL may have a closed curve shape. In addition, the sealing member SL may overlap the first line area LA1 and may be adjacent to the second voltage line VL2 in the first direction D1.

A first monitor pattern MP1 and a dam structure DS may be arranged in the first monitor area MA1. According to some embodiments, the dam structure DS may overlap the first monitor pattern MP1 and may be arranged on the first monitor pattern MP1.

According to some embodiments, the dam structure DS may extend in the second direction D2. The dam structure DS may prevent or reduce an organic layer (e.g., an organic layer OL in FIG. 3) formed in the display area DA from overflowing into the line area LA. In other words, the organic layer OL formed in the display area DA may be formed with the dam structure DS as a boundary. That is, according to some embodiments, the dam structure DS may serve as a dam or wall to contain the material of the organic layer OL during the deposition process, to prevent or reduce instances of the organic layer OL migrating or flowing into the adjacent area.

According to some embodiments, a plurality of the first monitor patterns MP1 may be located in the second direction D2. For example, the first monitor pattern MP1 may be arranged in an island shape. In other words, the first monitor pattern MP1 may be electrically floating (e.g., not electrically connected) with respect to other components. That is, the first monitor pattern MP1 may not be electrically connected to other components.

According to some embodiments, the first monitor pattern MP1 may be formed of a metal, an alloy, a conductive metal oxide, a transparent conductive material, or the like. In this case, an area overlapping the first monitor pattern MP1 may be monitored through the monitoring device. Accordingly, components formed in the area overlapping the first monitor pattern MP1 may be monitored. Accordingly, it may be monitored whether the organic layer OL and/or the inorganic layer overlapping the first monitor pattern MP1 (e.g., a second inorganic layer IL2 in FIG. 3) is formed in a target area using the first monitor pattern MP1.

However, embodiments according to the present invention are not limited thereto. For example, the first monitor pattern MP1 may be further formed in the non-display area NDA if necessary. In addition, the shape, number, position, etc. of the first monitor pattern MP1 may be set as needed. In addition, the shape of the dam structure DS is not limited thereto. For example, the dam structure DS may be arranged to surround the display area DA.

According to some embodiments, a dam structure and a second inspection pattern MP2 may be located in the second monitor area MA2, and a clock line, the second voltage line VL2, and the sealing member SL may be located in the second line area LA2. The second monitor area MA2 may have a structure substantially the same as a structure in which the first monitor area MA1 is symmetrical in the second direction D2 as an axis. In addition, the second line area LA2 may have a structure substantially the same as a structure in which the first line area LA1 is symmetrical in the second direction D2 as an axis.

FIG. 2 is a circuit diagram illustrating a pixel included in the display device of FIG. 1.

Referring to FIG. 2, the pixel PX may include a first transistor T1, a second transistor T2, a third transistor T3, a storage capacitor CST, and a light emitting diode LED.

The first transistor T1 may include a first terminal, a second terminal, and a gate terminal. The first terminal may receive the first voltage ELVDD. The second terminal may be connected to the light emitting diode LED. The gate terminal may be connected to the second transistor T2. The first transistor T1 may generate a driving current based on the first voltage ELVDD and the data voltage DATA.

The second transistor T2 may include a first terminal, a second terminal, and a gate terminal. The first terminal may receive the data voltage DATA. The second terminal may be connected to the first transistor T1. The gate terminal may receive the first gate signal SC. The second transistor T2 may transmit the data voltage DATA in response to the first gate signal SC.

The third transistor T3 may include a first terminal, a second terminal, and a gate terminal. The first terminal may be connected to the first transistor T1. The second terminal may receive an initialization voltage VINT. The gate terminal may receive the second gate signal SS. The third transistor T3 may transmit the initialization voltage VINT in response to the second gate signal SS.

The storage capacitor CST may include a first terminal and a second terminal. The first terminal may be connected to the gate terminal of the first transistor T1. The second terminal may be connected to the first terminal of the third transistor T3. The storage capacitor CST may maintain the voltage level of the gate terminal of the first transistor T1 during the inactivation period of the first gate signal SC.

The light emitting diode LED may include a first terminal and a second terminal. The first terminal may be connected to the second terminal of the first transistor T1. The second terminal may receive the second voltage ELVSS. The light emitting diode LED may emit light having a luminance corresponding to the driving current. The light emitting diode LED may include an organic light emitting diode using an organic material as a light emitting layer, an inorganic light emitting diode using an inorganic material as a light emitting layer, and the like.

Figure 3:
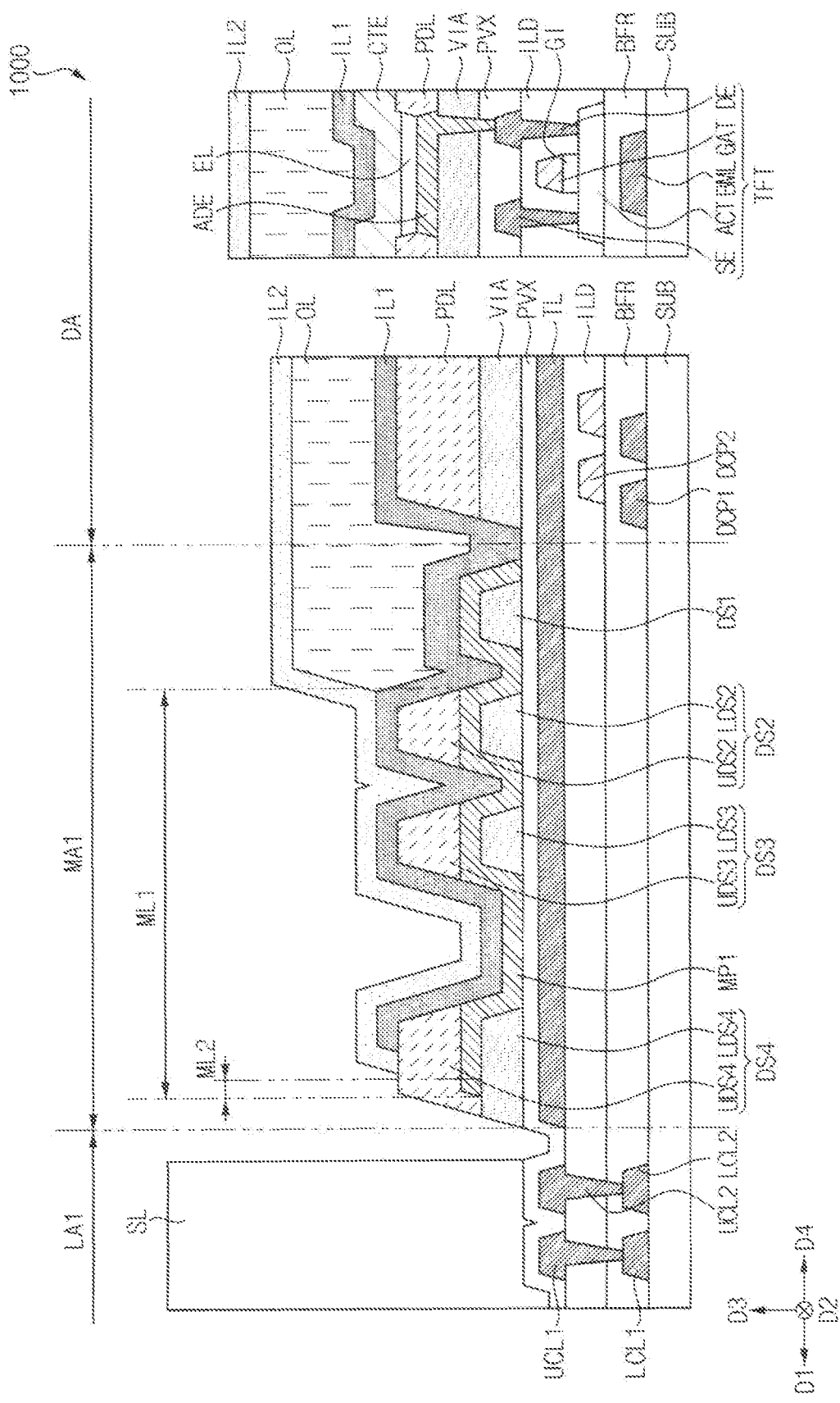
FIG. 3 is a cross-sectional view illustrating the display device of FIG. 1.

FIG. 3 is a cross-sectional view illustrating the display device of FIG. 1.

A substrate SUB may include a transparent or opaque material. According to some embodiments, examples of the material that can be used as the substrate SUB may be glass, quartz, plastic, or the like. These may be used alone or in combination with each other. In addition, the substrate SUB may be configured as a single layer or as a multi-layer in combination with each other.

A lower metal pattern BML, a first driving circuit pattern DCP1, a first lower clock line LCL1, and a second lower clock line LCL2 may be located on the substrate SUB.

According to some embodiments, the lower metal pattern BML, the first driving circuit pattern DCP1, the first lower clock line LCL1, and the second lower clock line LCL2 may be formed together.

Accordingly, the lower metal pattern BML, the first driving circuit pattern DCP1, the first lower clock line LCL1, and the second lower clock line LCL2 may include the same material. For example, the lower metal pattern BML, the first driving circuit pattern DCP1, the first lower clock line LCL1, and the second lower clock line LCL2 may be formed of a metal, an alloy, a conductive metal oxide, a transparent conductive material, or the like. Examples of a material that may be used as the lower metal pattern BML, the first driving circuit pattern DCP1, the first lower clock line LCL1, and the second lower clock line LCL2 may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"). These may be used alone or in combination with each other. In addition, each of the lower metal pattern BML, the first driving circuit pattern DCP1, the first lower clock line LCL1, and the second lower clock line LCL2 may be formed in a single layer or in combination with each other to form a multilayer structure.

According to some embodiments, the lower metal pattern BML may receive an initialization voltage VINT. For example, the lower metal pattern BML may correspond to the second terminal of the storage capacitor CST described with reference to FIG. 2. According to some embodiments, the lower metal pattern BML may receive the data voltage DATA. For example, the lower metal pattern BML may correspond to the data line DL described with reference to FIG. 1. However, the lower metal pattern BML is not limited thereto.

A buffer layer BFR may be located on the substrate SUB, and may cover the lower metal pattern BML, the first driving circuit pattern DCP1, the first lower clock line LCL1, and the second lower clock line LCL2. According to some embodiments, the buffer layer BFR may be formed of an inorganic insulating material. Examples of the material that can be used as the inorganic insulating material may be silicon oxide, silicon nitride, silicon oxynitride, and the like. These may be used alone or in combination with each other. The buffer layer BFR may prevent or reduce diffusion of metal atoms, atoms, or impurities from the substrate SUB to the active pattern ACT. In addition, the buffer layer BFR may control a heat supply rate during a crystallization process for forming the active pattern ACT.

The active pattern ACT may be located on the buffer layer BFR. According to some embodiments, the active pattern ACT may be formed of a silicon semiconductor material or an oxide semiconductor material. Examples of the silicon semiconductor material that may be used as the active pattern ACT may be amorphous silicon, polycrystalline silicon, or the like. Examples of the oxide semiconductor material that may be used as the active pattern ACT may include IGZO (InGaZnO), ITZO (InSnZnO), and the like. In addition, the oxide semiconductor material may further include indium ("In"), gallium ("Ga"), tin ("Sn"), zirconium ("Zr"), vanadium ("V"), hafnium ("Hf"), cadmium ("Cd"), germanium ("Ge"), chromium ("Cr"), titanium ("Ti"), and zinc ("Zn"). These may be used alone or in combination with each other.

Agate insulating layer GI may be located on the buffer layer BFR and may cover the active pattern ACT. According to some embodiments, the gate insulating layer GI may be formed of an insulating material. Examples of the insulating material that can be used as the gate insulating layer GI may be silicon oxide, silicon nitride, silicon oxynitride, and the like. These may be used alone or in combination with each other.

Agate electrode GAT may be located on the gate insulating layer GI. According to some embodiments, the gate electrode GAT may be formed of a metal, an alloy, a conductive metal oxide, a transparent conductive material, or the like. For example, the gate electrode GAT may correspond to the gate terminal of the first transistor T1 described with reference to FIG. 2.

A second driving circuit pattern DCP2 may be located on the buffer layer BFR. The first driving circuit pattern DCP1 and the second driving circuit pattern DCP2 may correspond to the gate driver GDV described with reference to FIG. 1

According to some embodiments, the gate electrode GAT and the second driving circuit pattern DCP2 may be formed together.

An interlayer insulating layer ILD may be located on the buffer layer BFR and the gate insulating layer GI. The interlayer insulating layer ILD may cover the gate electrode GAT and the second driving circuit pattern DCP2. According to some embodiments, the interlayer insulating layer ILD may be formed of an insulating material. Examples of the insulating material that can be used as the interlayer insulating layer ILD may be silicon oxide, silicon nitride, silicon oxynitride, and the like. These may be used alone or in combination with each other.

A first connection electrode SE, a second connection electrode DE, a transmission line TL, a first upper clock line UCL1, and a second upper clock line UCL2 may be located on the interlayer insulating layer ILD.

According to some embodiments, the first connection electrode SE, the second connection electrode DE, the transmission line TL, the first upper clock line UCL1, and the second upper clock line UCL2 may be formed together.

Accordingly, the first connection electrode SE, the second connection electrode DE, the transmission line TL, the first upper clock line UCL1, and the second upper clock line UCL2 may include a same material. For example, the first connection electrode SE, the second connection electrode DE, the transmission line TL, the first upper clock line UCL1, and the second upper clock line UCL2 may be formed of a metal, an alloy, a conductive metal oxide, a transparent conductive material, or the like.

According to some embodiments, the first connection electrode SE and the second connection electrode DE may contact the active pattern ACT. Accordingly, the lower metal pattern BML, the active pattern ACT, the gate electrode GAT, the first connection electrode SE, and the second connection electrode DE may constitute a transistor TFT. According to some embodiments, the active pattern ACT, the gate electrode GAT, the first connection electrode SE, and the second connection electrode DE may constitute a transistor TFT.

The transmission line TL may be electrically connected to the first connection electrode SE and/or the second connection electrode DE. The first upper clock line UCL1 may contact the first lower clock line LCL1. The first upper clock line UCL1 and the first lower clock line LCL1 may correspond to the clock line CL described with reference to FIG. 1. The second upper clock line UCL2 may contact the second lower clock line LCL2.

A passivation layer PVX may be located on the interlayer insulating layer ILD. According to some embodiments, the passivation layer PVX may overlap the display area DA, the first monitor area MA1, and the first line area LA1. Accordingly, the passivation layer PVX may cover the first connection electrode SE, the second connection electrode DE, the transmission line TL, the first upper clock line UCL1, and the second upper clock line UCL2.

According to some embodiments, the passivation layer PVX may be formed of an inorganic insulating material. Examples of the inorganic insulating material that can be used as the passivation layer PVX may be silicon oxide, silicon nitride, silicon oxynitride, and the like. These may be used alone or in combination with each other.

According to some embodiments, the passivation layer PVX may be omitted.

The via insulating layer VIA and lower structures may be located on the passivation layer PVX. According to some embodiments, the lower structures may include a first dam structure DS1, a second lower structure LDS2, a third lower structure LDS3, and a fourth lower structure LDS4.

According to some embodiments, the via insulating layer VIA, the first dam structure DS1, the second lower structure LDS2, the third lower structure LDS3, and the fourth lower structure LDS4 may be formed together.

Accordingly, according to some embodiments, the via insulating layer VIA, the first dam structure DS1, the second lower structure LDS2, the third lower structure LDS3, and the fourth lower structure LDS4 may contain the same organic material. An organic material that may be used as the via insulating layer VIA, the first dam structure DS1, the second lower structure LDS2, the third lower structure LDS3, and the fourth lower structure LDS4 may be a photoresist, a polyacrylic resin, a polyimide-based resin, an acrylic resin, and the like. These may be used alone or in combination with each other.

According to some embodiments, the passivation layer PVX may be omitted. In this case, the via insulating layer VIA, the first dam structure DS1, the second lower structure LDS2, the third lower structure LDS3, and the fourth lower structure LDS4 may include an organic material and an inorganic material. Material that can be used as the via insulating layer VIA, the first dam structure DS1, the second lower structure LDS2, the third lower structure LDS3, and the fourth lower structure LDS4 may be photoresist, polyacrylic resin, polyimide resin, acrylic resin, silicon oxide, silicon nitride, silicon oxynitride, and the like. These may be used alone or in combination with each other.

The via insulating layer VIA may overlap the display area DA. The via insulating layer VIA may provide a flat upper surface on which the first electrode ADE is formed.

The first dam structure DS1, the second lower structure LDS2, the third lower structure LDS3, and the fourth lower structure LDS4 may be spaced apart from each other.

The first electrode ADE may be located on the via insulating layer VIA. According to some embodiments, the first electrode ADE may be electrically connected to the transistor TFT through the second connection electrode DE. According to some embodiments, the first electrode ADE may be connected to the first connection electrode SE. According to some embodiments, the first electrode ADE may be connected to the lower metal pattern BML through the first connection electrode SE.

The first monitor pattern MP1 may be located on the lower structures. In other words, the first monitor pattern MP1 may be located on the first dam structure DS1, the second lower structure LDS2, the third lower structure LDS3, and the fourth lower structure LDS4.

According to some embodiments, the first electrode ADE and the first monitor pattern MP1 may be formed together. Accordingly, the first electrode ADE and the first monitor pattern MP1 may have the same thickness. For example, the thickness of the first electrode ADE and the thickness of the first monitor pattern MP1 may be about 1000 angstroms to about 2000 angstroms. According to some embodiments, the first electrode ADE and the first monitor pattern MP1 may have different thicknesses.

Accordingly, the first electrode ADE and the first monitor pattern MP1 may include the same material. For example, the first electrode ADE and the first monitor pattern MP1 may be formed of a metal, an alloy, a conductive metal oxide, a transparent conductive material, or the like. Examples of the material that can be used as the first electrode ADE and the first monitor pattern MP1 may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), or the like. These may be used alone or in combination with each other.

In addition, each of the first electrode ADE and the first monitor pattern MP1 may be configured as a single layer or as a multi-layer by combining with each other. For example, each of the first electrode ADE and the first monitor pattern MP1 may have an ITO/Ag/ITO structure.

According to some embodiments, the first monitor pattern MP1 may contact an upper surface and a side surface of each of the first dam structure DS1, the second lower structure LDS2, the third lower structure LDS3, and the fourth lower structure LDS4. In addition, the first monitor pattern MP1 may contact an upper surface of the passivation layer PVX. In other words, the first monitor pattern MP1 may be arranged along a profile of the passivation layer PVX, the first dam structure DS1, the second lower structure LDS2, the third lower structure LDS3, and a fourth lower structure LDS4.

According to some embodiments, a contact hole may not be defined in the passivation layer PVX which contacts the first monitor pattern MP1. In other words, the first monitor pattern MP1 may not be electrically connected to a configuration arranged under the first monitor pattern MP1.

According to some embodiments, a contact hole may not be defined in the lower structures which contacts the first monitor pattern MP1. For example, a contact hole may not defined in the first dam structure DS1, the second lower structure LDS2, the third lower structure LDS3, and the fourth lower structure LDS4 which contact the first monitor pattern MP1. In other words, the first monitor pattern MP1 may not be electrically connected to a configuration arranged under the first monitor pattern MP1.

A pixel defining layer PDL and upper structures may be located on the via insulating layer VIA. According to some embodiments, the upper structures may include a second upper structure UDS2, a third upper structure UDS3, and a fourth upper structure UDS4.

According to some embodiments, the pixel defining layer PDL, the second upper structure UDS2, the third upper structure UDS3, and the fourth upper structure UDS4 may be formed together.

Accordingly, the pixel defining layer PDL, the second upper structure UDS2, the third upper structure UDS3, and the fourth upper structure UDS4 may include the same organic material. Examples of the organic material that may be used as the pixel defining layer PDL, the second upper structure UDS2, the third upper structure UDS3, and the fourth upper structure UDS4 may be a photoresist, a polyacrylic resin, polyimide-based resins, acrylic resins, and the like. These may be used alone or in combination with each other.

The pixel defining layer PDL may overlap the display area DA. The pixel defining layer PDL may provide an opening for the emission layer EL to be formed.

The second upper structure UDS2, the third upper structure UDS3, and the fourth upper structure UDS4 may be spaced apart from each other. The second upper structure UDS2 may overlap the second lower structure LDS2, the third upper structure UDS3 may overlap the third lower structure LDS3, and the fourth upper structure UDS4 may overlap the fourth lower structure LDS4.

Each of the lower structures and the upper structures may correspond to the dam structure DS described with reference to FIG. 1. For example, the second lower structure LDS2 and the second upper structure UDS2 may constitute a second dam structure DS2, the third lower structure LDS3 and the third upper structure UDS3 may constitute a third dam structure DS3, and the fourth lower structure LDS4 and the fourth upper structure UDS4 may constitute a fourth dam structure DS4.

The first monitor pattern MP1 may be located under the second upper structure UDS2, the third upper structure UDS3, and the fourth upper structure UDS4. In other words, the first monitor pattern MP1 may be located between the second lower structure LDS2 and the second upper structure UDS2, between the third lower structure LDS3 and the third upper structure UDS3, and between the fourth lower structure LDS4 and the fourth upper structure UDS4.

According to some embodiments, a contact hole may not be defined in the upper structures which contact the first monitor pattern MP1. For example, a contact hole may not be defined in the second upper structure UDS2, the third upper structure UDS3, and the fourth upper structure UDS4 which contact the first monitor pattern MP1. Accordingly, the first monitor pattern MP1 contacting the second upper structure UDS2, the third upper structure UDS3, and the fourth upper structure UDS4 may not be exposed. In other words, the first monitor pattern MP1 may not be electrically connected to a configuration located on the first monitor pattern MP1.

The emission layer EL may be located on the first electrode ADE. The second electrode CTE may be located on the emission layer EL. The emission layer EL may emit light based on a voltage difference between the first electrode ADE and the second electrode CTE.

A first inorganic layer IL1 may be located on the second electrode CTE, the pixel defining layer PDL, the first monitor pattern MP1, and the second upper structure UDS2. The first inorganic layer IL1 may overlap the display area DA and the first monitor area MA1. According to some embodiments, the first inorganic layer IL1 may be formed of an inorganic material. Examples of the inorganic material that can be used as the first inorganic layer IL1 may be silicon oxide, silicon nitride, silicon oxynitride, and the like. These may be used alone or in combination with each other.

According to some embodiments, a contact hole may not be defined in the first inorganic layer IL1 which contact the first monitor pattern MP1. In other words, the first monitor pattern MP1 may not be electrically connected to a configuration located under the first monitor pattern MP1.

According to some embodiments, the first monitor pattern MP1 may be completely covered by the passivation layer PVX, the lower structures, the upper structures, and the first inorganic layer IL1.

The organic layer OL may be located on the first inorganic layer IL1. The organic layer OL may overlap the display area DA. In addition, a portion of the organic layer OL may overlap the first monitor pattern MP1.

According to some embodiments, when viewed in a plan view, the first monitor pattern MP1 may further extend from the organic layer OL in the first direction D1 by a first margin distance ML1. In other words, a portion of the first monitor pattern MP1 may overlap the organic layer OL, and another portion of the first monitor pattern MP1 may extend toward the first line area LA1. Accordingly, an end of the organic layer OL may be positioned on the first monitor pattern MP1.

A second inorganic layer IL2 may be located on the organic layer OL and the first inorganic layer IL1. The second inorganic layer IL2 may overlap the display area DA and the first monitor area MA1. In addition, a portion of the second inorganic layer IL2 may overlap the first monitor pattern MP1.

According to some embodiments, when viewed in a plan view, the first monitor pattern MP1 may further extend from the second inorganic layer IL2 by a second margin distance ML2 in the first direction D1. In other words, a portion of the first monitor pattern MP1 may overlap the second inorganic layer IL2, and another portion of the first monitor pattern MP1 may extend toward the first line area LA1. Accordingly, an end of the second inorganic layer IL2 may be positioned on the first monitor pattern MP1.

According to some embodiments, the first margin distance ML1 may be greater than the second margin distance ML2. In other words, the second inorganic layer IL2 may extend further to the first line area LA1 than the organic layer OL.

The sealing member SL may be located on the passivation layer PVX and may overlap the first line area LA1.

In the manufacturing process of the display device 1000 according to some embodiments of the present invention, an area overlapping the first monitor pattern MP1 may be monitored through a monitoring device. Accordingly, components formed in the area overlapping the first monitor pattern MP1 may be monitored. In other words, an end of the organic layer OL and an end of the second inorganic layer IL2 which are positioned on the first monitor pattern MP1 may be monitored. Accordingly, it may be monitored whether the organic layer OL and/or the second inorganic layer IL2 are properly formed in the first monitor area MA1.

FIGS. 4, 5, 6, 7, 8, and 9 are cross-sectional views illustrating a method of manufacturing the display device of FIG. 3.

Figure 4:
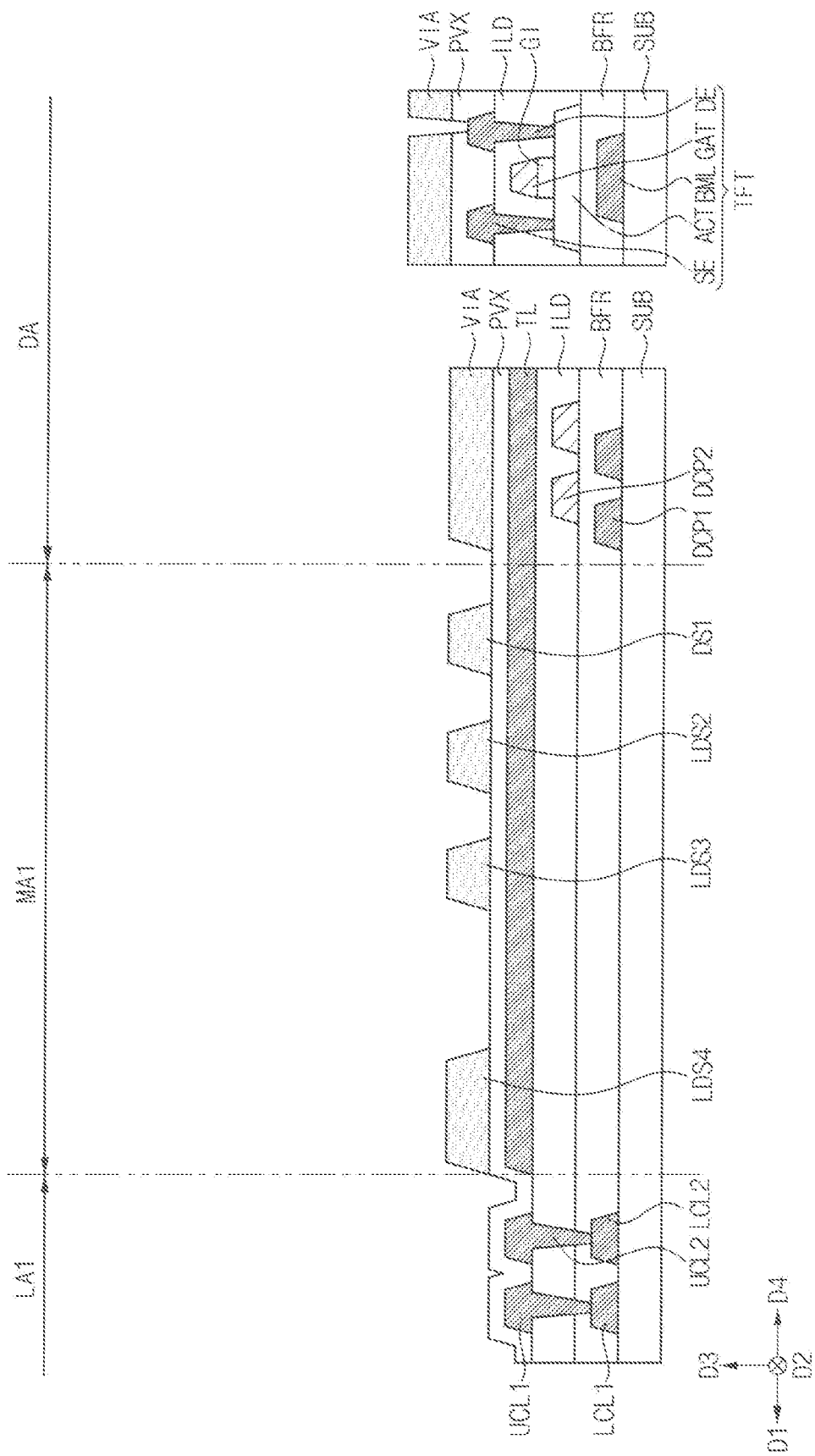
FIGS. 4, 5, 6, 7, 8, and 9 are cross-sectional views illustrating a method of manufacturing the display device of FIG. 3.

Referring to FIG. 4, after a via layer is formed on the passivation layer PVX, the via layer is patterned to form the via insulating layer VIA and the lower structures together. As described above, the lower structures may include the first dam structure DS1, the second lower structure LDS2, the third lower structure LDS3, and the fourth lower structure LDS4.

Figure 5:
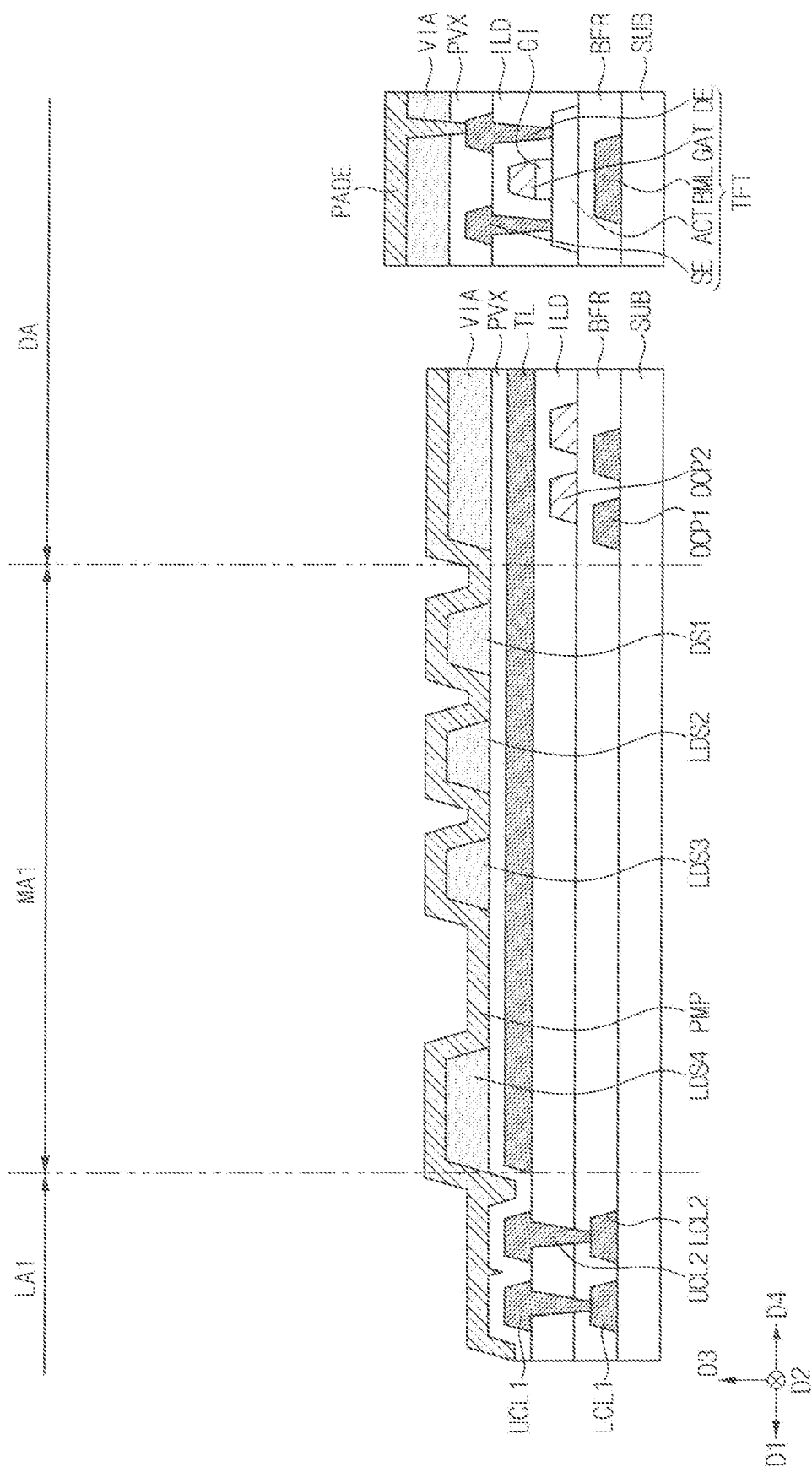

Referring to FIG. 5, a preliminary first electrode PADE may be formed on the via insulating layer VIA, and a preliminary first monitor pattern PMP may be formed on the first dam structure DS1, the second lower structure LDS2, the third lower structure LDS3, and the fourth lower structure LDS4. The preliminary first electrode PADE may overlap the display area DA, and the preliminary first monitor pattern PMP may overlap the first monitor area MA1 and the first line area LA1. According to some embodiments, the preliminary first electrode PADE and the preliminary first monitor pattern PMP may be connected to each other and formed together.

Figure 6:
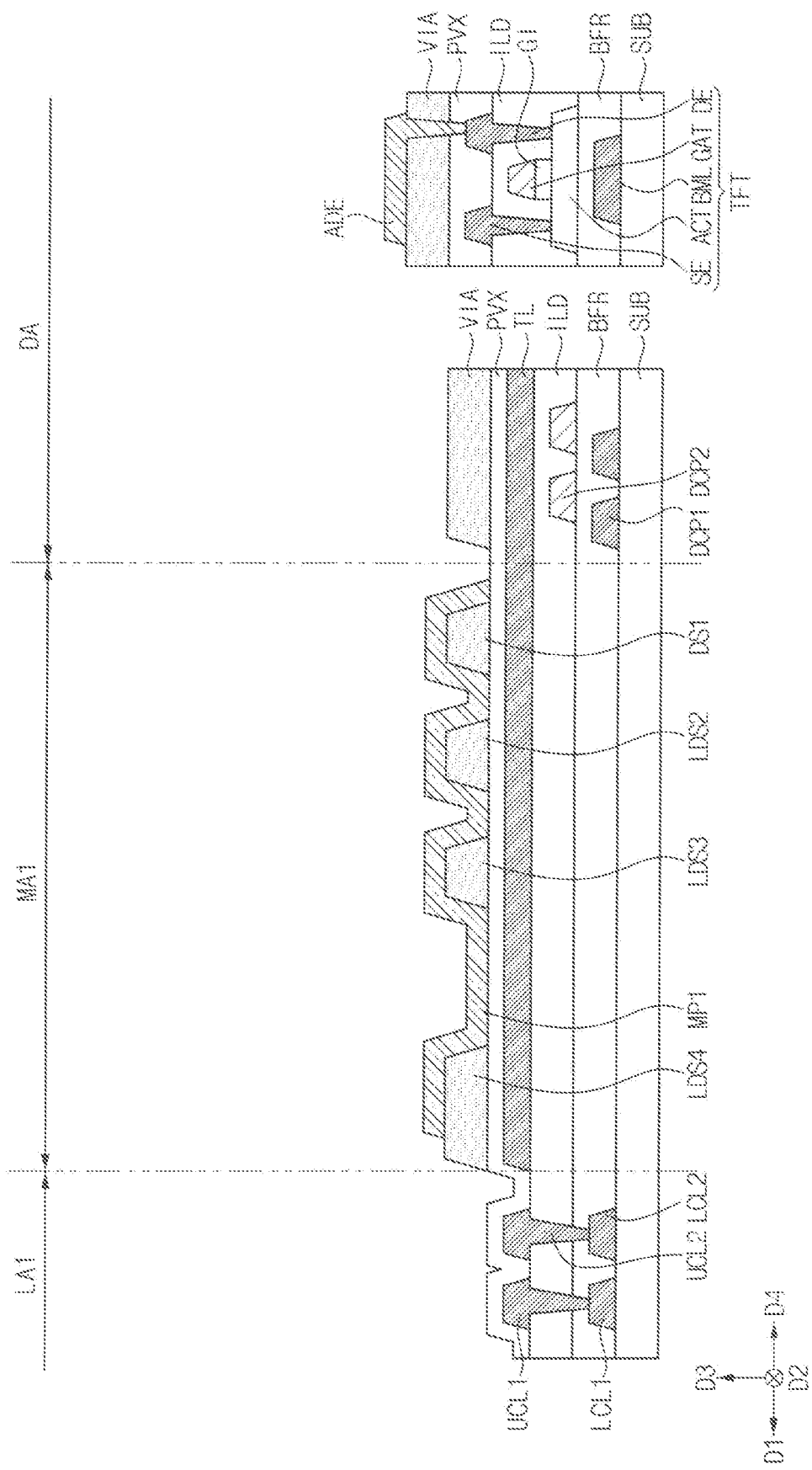

Referring to FIG. 6, the first electrode ADE and the first monitor pattern MP1 may be formed by patterning the preliminary first electrode PADE and the preliminary first monitor pattern PMP.

Figure 7:
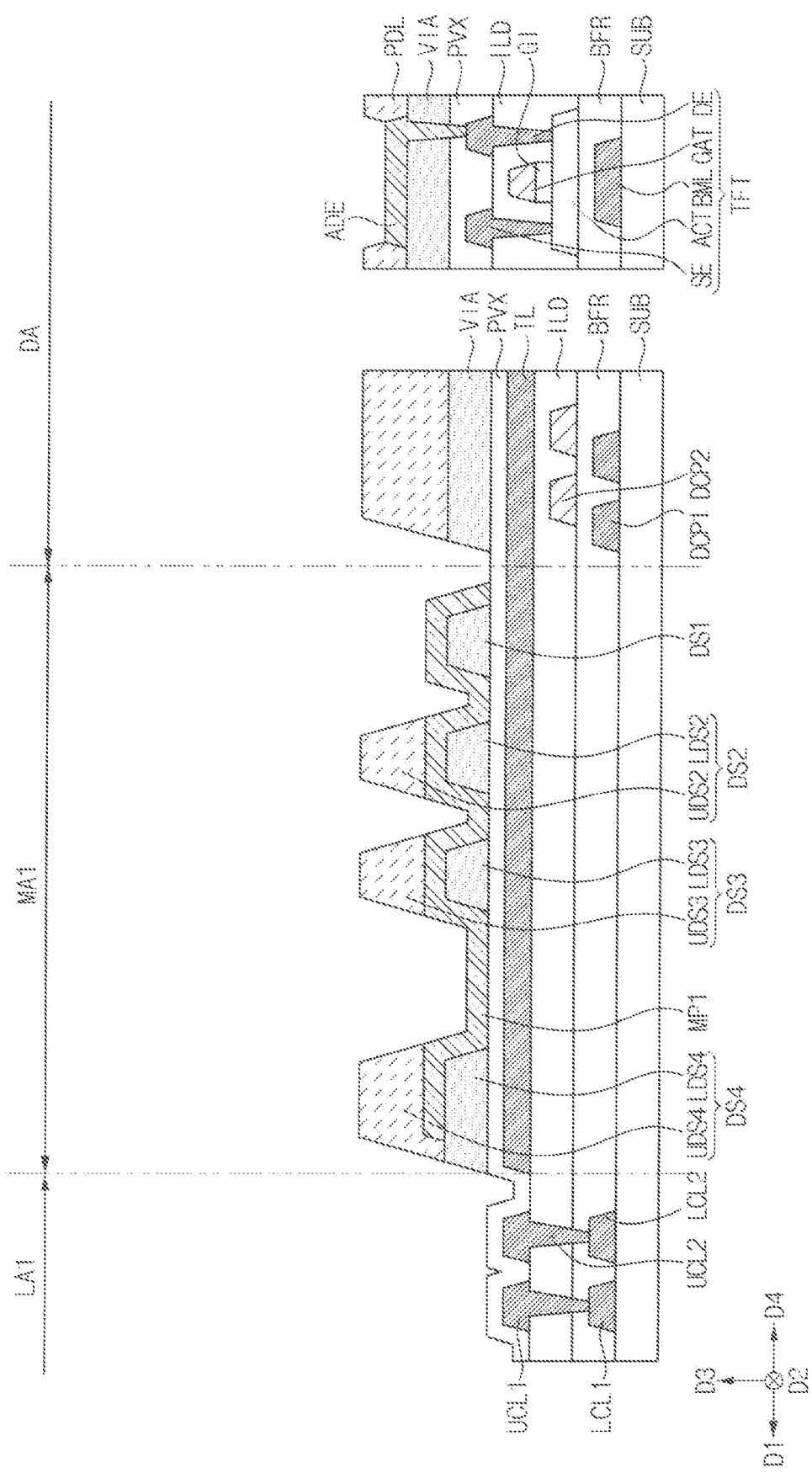

Referring to FIG. 7, the pixel defining layer PDL, the second upper structure UDS2, the third upper structure UDS3, and the fourth upper structure UDS4 may be formed together. The fourth upper structure UDS4 may be formed to cover an end of the first monitor pattern MP1.

Figure 8:
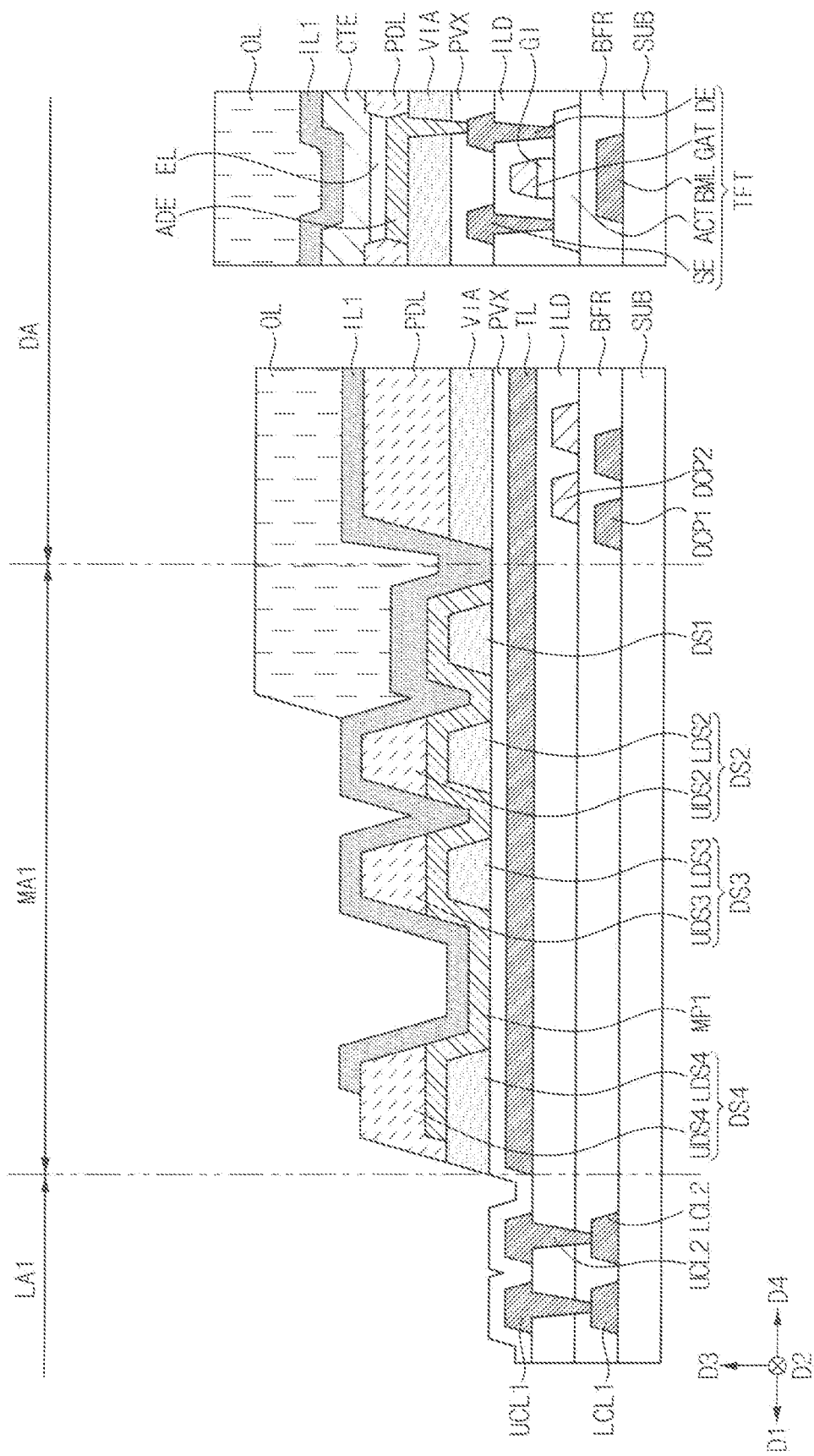

Referring to FIG. 8, the first inorganic layer IL1 and the organic layer OL may be formed. As described above, a portion of the organic layer OL may be formed to overlap the first monitor area MA1. According to some embodiments, the organic layer OL may be formed through an inkjet process.

Figure 9:
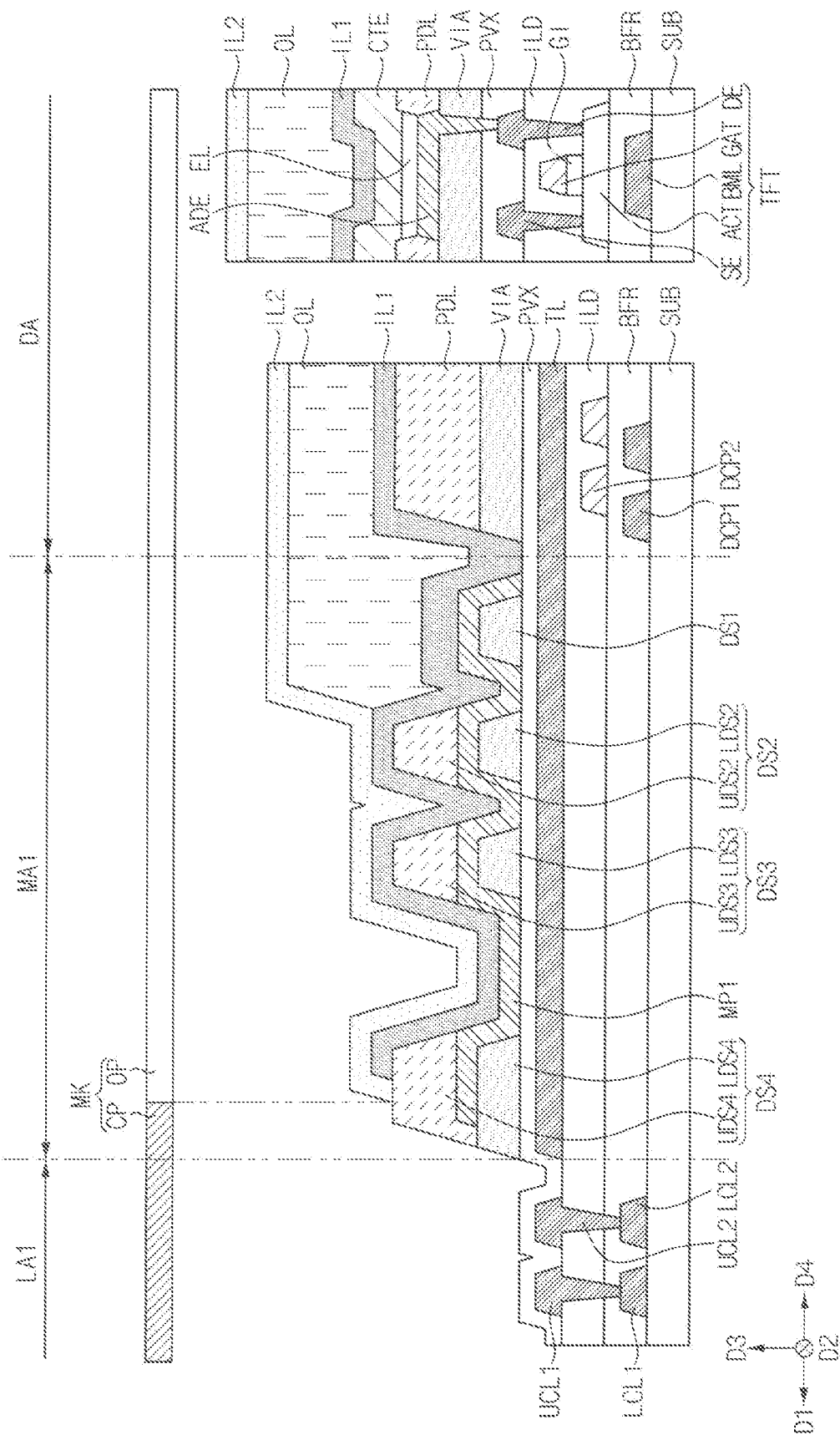

Referring to FIG. 9, according to some embodiments, the second inorganic layer IL2 may be formed using a mask MK. The mask MK may include an open portion OP and a shielding portion CP. The second inorganic layer IL2 may be formed in an area corresponding to the open portion OP.

Figure 10:
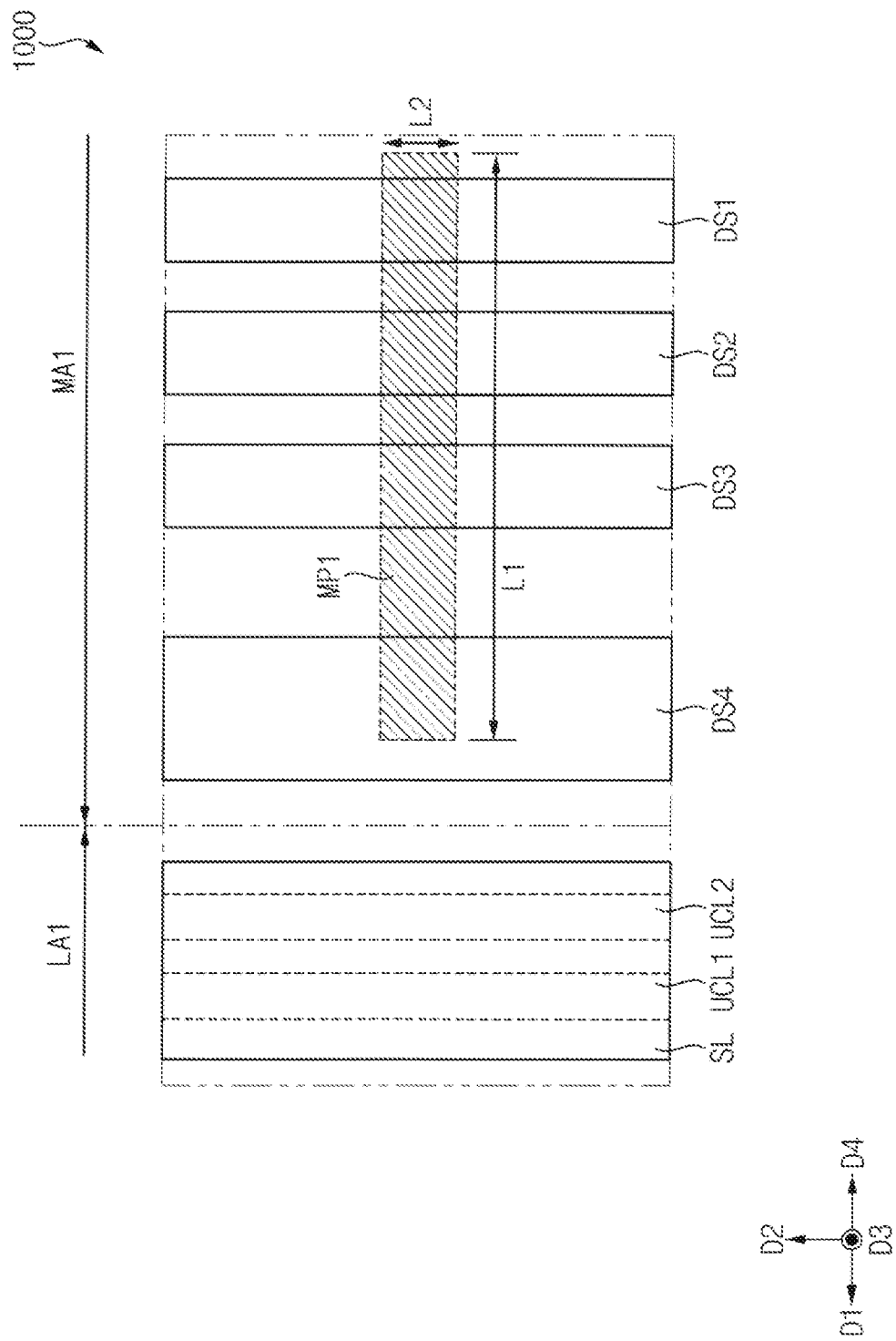
FIG. 10 is an enlarged plan view illustrating the display device of FIG. 1.

FIG. 10 is an enlarged plan view illustrating the display device of FIG. 1.

Referring to FIG. 10, the first to fourth dam structures DS1, DS2, DS3, and DS4 may be located in the first monitor area MA1, and the first monitor pattern MP1 may be located under the first to fourth dam structures DS1, DS2, DS3, and DS4. The sealing member SL may be located in the first line area LA1, and the first and second upper clock lines UCL1 and UCL2 may be located under the sealing member SL.

The first monitor pattern MP1 may be located to overlap the first to fourth dam structures DS1, DS2, DS3, and DS4. According to some embodiments, the first monitor pattern MP1 may have a rectangular shape including a long side in the first direction D1 and a short side in the second direction D2. A first length L1 of the long side of the first monitor pattern MP1 may be about 800 μm or more and 2000 μm or less. A second length L2 of the short side of the first monitor pattern MP1 may be about 100 μm. However, the present invention is not limited thereto. The first length L1 and the second length L2 may be appropriately set as needed.

Figure 11:
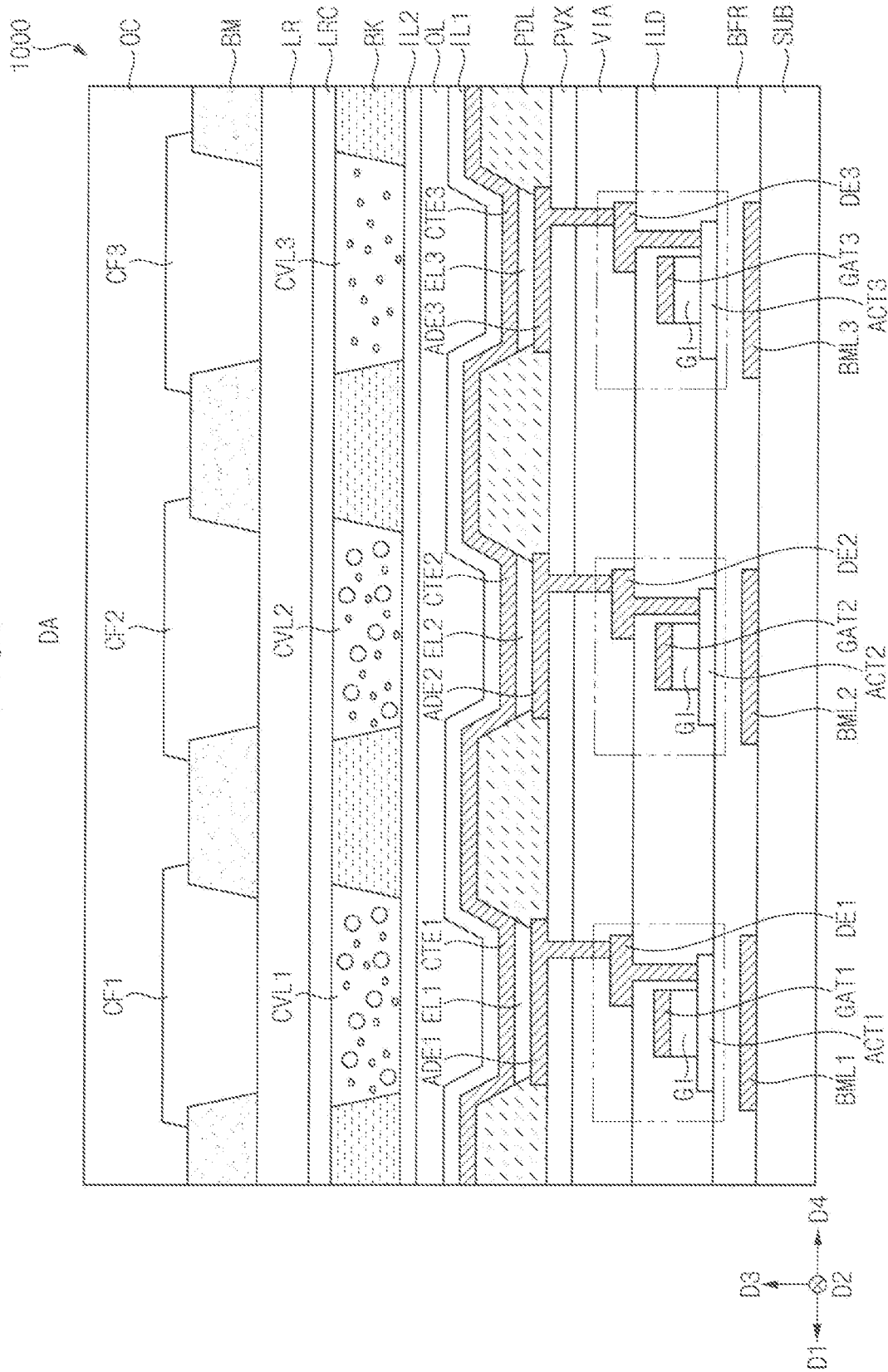
FIG. 11 is a cross-sectional view illustrating the display device of FIG. 1.

FIG. 11 is a cross-sectional view illustrating the display device of FIG. 1.

Referring to FIG. 11, the substrate SUB, first to third lower metal patterns BML1, BML2, and BML3, first to third active patterns ACT1, ACT2, and ACT3, first to third gate electrodes GAT1, GAT2, and GAT3, second connection electrodes DE1, DE2, and DE3, the first to third pixel electrodes ADE1, ADE2, and ADE3, first to third emission layers EL1, EL2, and EL3, the second electrode CTE, the first inorganic layer IL1, the organic layer OL, the second inorganic layer IL2, a bank layer BK, a first color conversion layer CVL1, a second color conversion layer CVL2, a third color conversion layer CVL3, a refractive layer LR, a light blocking layer BM, a first color filter CF1, a second color filter CF2, a third color filter CF3, and a planarization layer OC may be located in the display area DA of the display device 1000.

The first to third lower metal patterns BML1, BML2, and BML3 may correspond to the lower metal pattern BML described with reference to FIG. 3. The first to third active patterns ACT1, ACT2, and ACT3 may correspond to the active pattern ACT. The first to third gate electrodes GAT1, GAT2, and GAT3 may correspond to the gate electrode GAT. The second connection electrodes DE1, DE2, and DE3 may correspond to the second connection electrode DE. The first to third pixel electrodes ADE1, ADE2, and ADE3 may correspond to the first electrode ADE. The first to third emission layers EL1, EL2, and EL3 may correspond to the emission layer EL.

The bank layer BK may be located on the second inorganic layer IL2. The bank layer BK may be formed of a light blocking material and may block light emitted from a lower portion. In addition, an opening exposing the second inorganic layer IL2 may be formed in the bank layer BK.

The first color conversion layer CVL1 may overlap the first emission layer EL1. According to some embodiments, the first color conversion layer CVL1 may convert a wavelength of light emitted from the first emission layer EL1. For example, the first color conversion layer CVL1 may include a phosphor, a scatterer, or quantum dots. As the light emitted from the first emission layer EL1 passes through the first color conversion layer CVL1, light having a first color (e.g., green light) may be emitted.

The second color conversion layer CVL2 may overlap the second emission layer EL2. According to some embodiments, the second color conversion layer CVL2 may convert a wavelength of light emitted from the second emission layer EL2. For example, the second color conversion layer CVL2 may include a phosphor, a scatterer, or quantum dots. As the light emitted from the second emission layer EL2 passes through the second color conversion layer CVL2, light having a second color (e.g., red light) may be emitted.

The third color conversion layer CVL3 may overlap the third emission layer EL3. According to some embodiments, the third color conversion layer CVL3 may scatter a wavelength of light emitted from the third emission layer EL3. For example, the third color conversion layer CVL3 may include a transparent polymer material, a scatterer, or the like. As light emitted from the third emission layer EL3 passes through the third color conversion layer CVL3, light having a third color (e.g., blue light) may be emitted.

According to some embodiments, the refractive layer LR may be located on the first to third color conversion layers CVL1, CVL2, and CVL3. The refractive layer LR may have a predetermined refractive index. Accordingly, the light efficiency of the display device 1000 may be improved. In addition, a capping layer LRC may be further located under the refractive layer LR. The capping layer LRC may protect the refractive layer LR. According to some embodiments, the refractive layer LR may be located under the first to third color conversion layers CVL1, CVL2, and CVL3. According to some embodiments, the refractive layer LR may include first and second refractive layers, the first refractive layer may be located on the first to third color conversion layers CVL1, CVL2, and CVL3, and the second refractive layer may be located under the first to third color conversion layers CVL1, CVL2, and CVL3.

The light blocking layer BM may be located on the refractive layer LR. The light blocking layer BM may be formed of a light blocking material, and may block light emitted from a lower portion. In addition, an opening exposing the refractive layer LR may be formed in the light blocking layer BM.

The first color filter CF1 may overlap the first color conversion layer CVL1. According to some embodiments, the first color filter CF1 may transmit light having a wavelength corresponding to green light.

The second color filter CF2 may overlap the second color conversion layer CVL2. According to some embodiments, the second color filter CF2 may transmit light having a wavelength corresponding to red light.

The third color filter CF3 may overlap the third color conversion layer CVL3. According to some embodiments, the third color filter CF3 may transmit light having a wavelength corresponding to blue light.

The planarization layer OC may be located on the first to third color filters CF1, CF2, and CF3. The planarization layer OC may be formed of an organic material and may provide a substantially flat upper surface.

Figure 12:
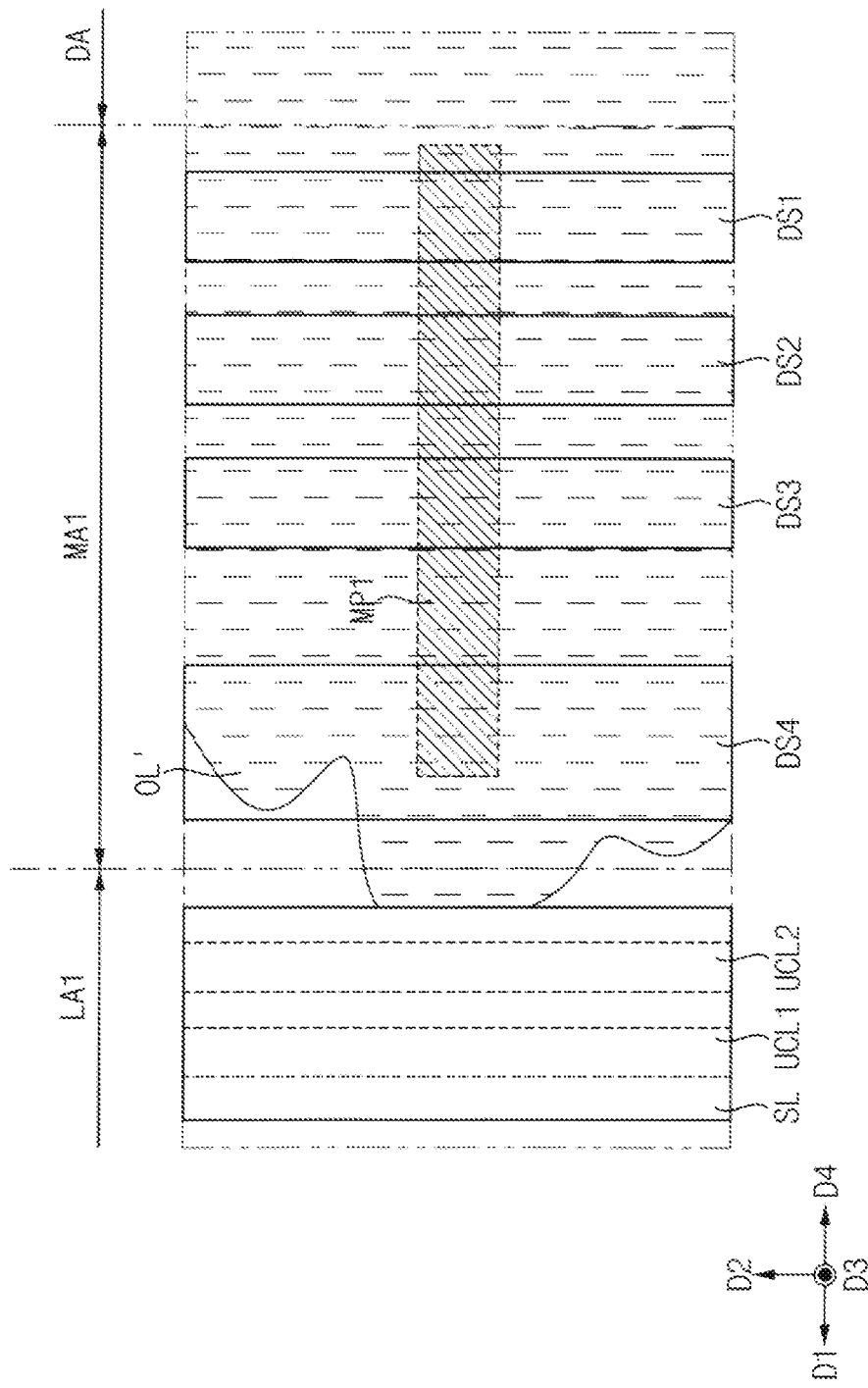
FIG. 12 is an enlarged plan view illustrating a case in which reflow of an organic layer included in the display device of FIG. 10 is increased.
Figure 13:
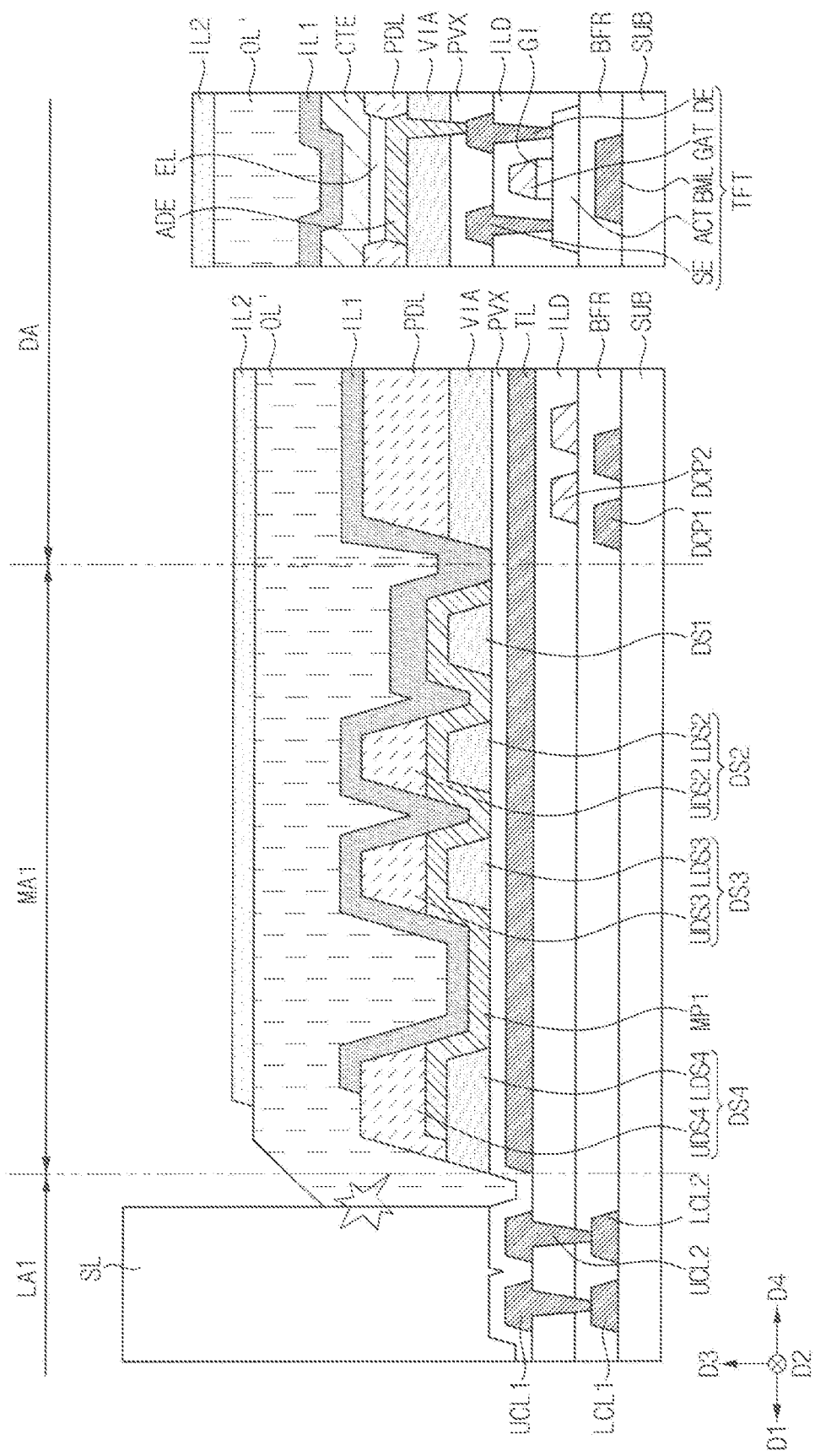
FIG. 13 is a cross-sectional view illustrating the display device of FIG. 12.

FIG. 12 is an enlarged plan view illustrating a case in which reflow of an organic layer included in the display device of FIG. 10 is increased. FIG. 13 is a cross-sectional view illustrating the display device of FIG. 12.

Referring to FIGS. 12 and 13, a reflow of a first defective organic layer OL' may be increased. For example, as shown in FIG. 12, the first defective organic layer OL' may invade the first line area LA1. Accordingly, as shown in FIG. 13, the first defective organic layer OL' may contact the sealing member SL. When the first defective organic layer OL' contacts the sealing member SL, a defect in which the sealing member SL is burst may occur.

In this case, the first defective organic layer OL' may completely overlap the first monitor pattern MP1. In other words, the end of the first defective organic layer OL' may not be positioned on the first monitor pattern MP1. Accordingly, in the area overlapping the first monitor pattern MP1, the end of the first defective organic layer OL' may not be monitored. Accordingly, a defect in the display device may be detected early.

Figure 14:
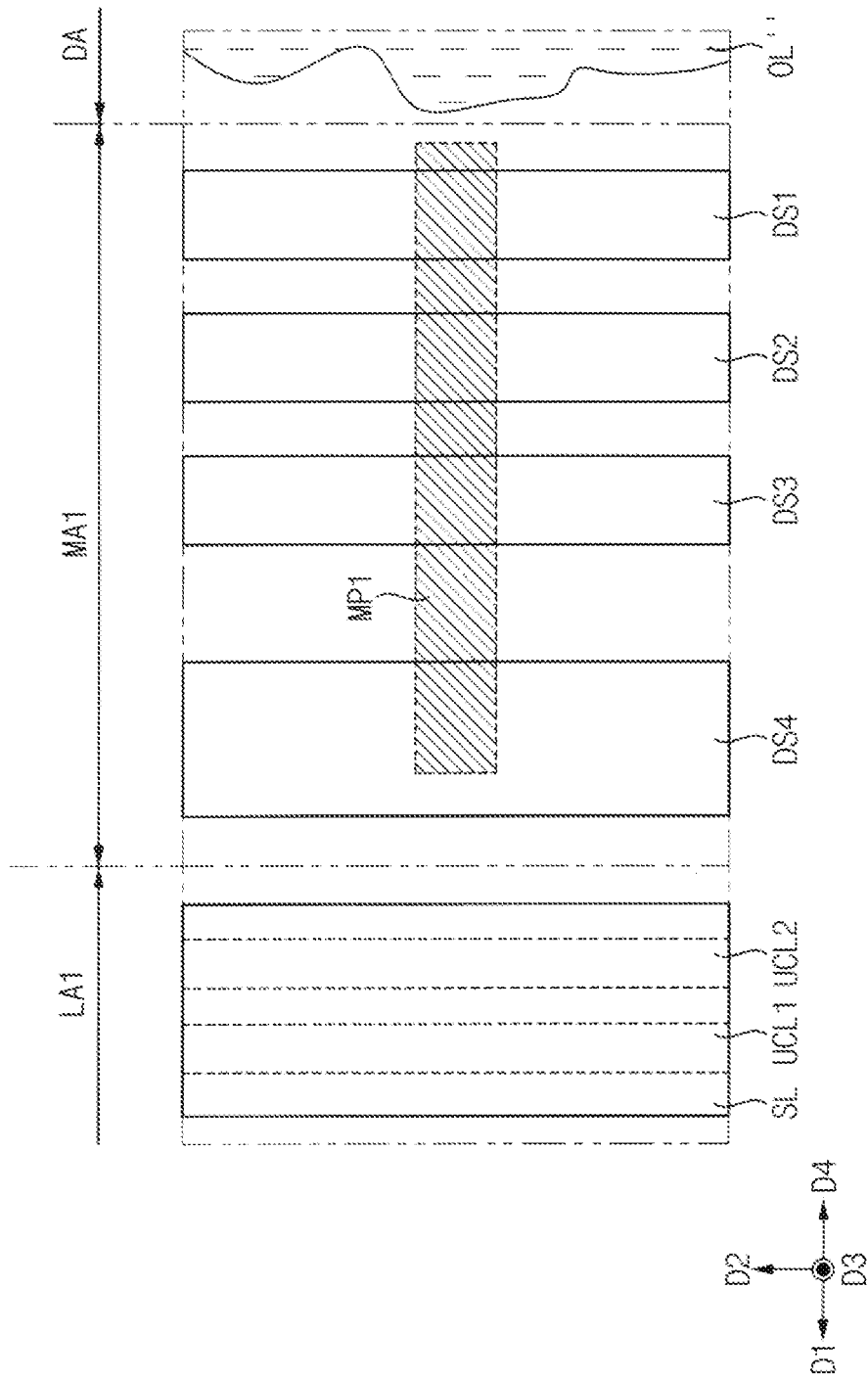
FIG. 14 is an enlarged plan view illustrating a case in which reflow of an organic layer included in the display device of FIG. 10 is decreased.
Figure 15:
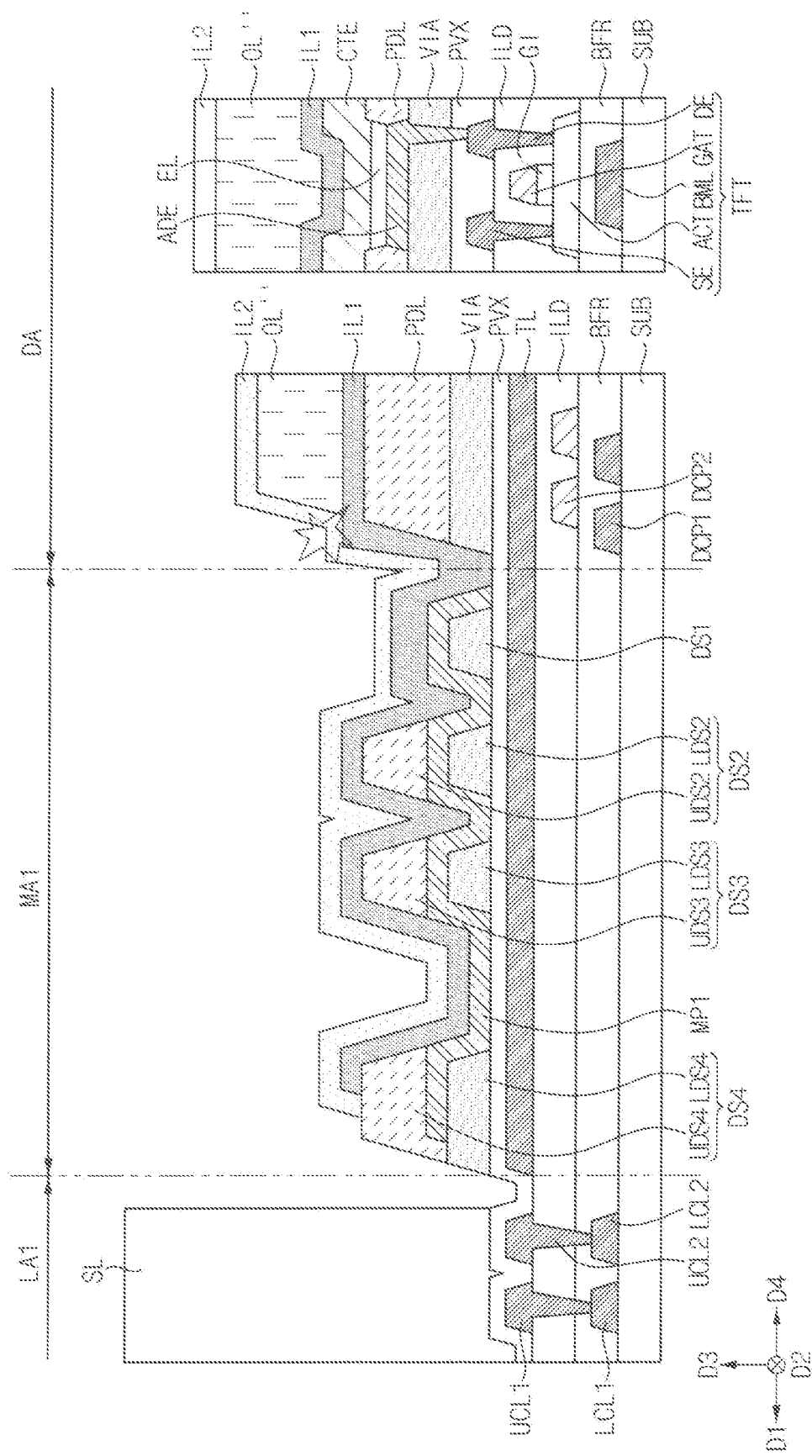
FIG. 15 is a cross-sectional view illustrating the display device of FIG. 14.

FIG. 14 is an enlarged plan view illustrating a case in which reflow of an organic layer included in the display device of FIG. 10 is decreased. FIG. 15 is a cross-sectional view illustrating the display device of FIG. 14.

Referring to FIGS. 14 and 15, a reflow of the second defective organic layer OL" may be reduced. For example, as shown in FIG. 14, the second defective organic layer OL" may not be formed until the first monitor area MA1. Accordingly, as shown in FIG. 15, the second inorganic layer IL2 may contact the first inorganic layer IL1 in the display area DA. When the second inorganic layer IL2 contacts the first inorganic layer IL1, a crack may occur in the contact area.

In this case, the second defective organic layer OL" may not overlap the first monitor pattern MP1. In other words, an end of the second defective organic layer OL" may not be positioned on the first monitor pattern MP1. Accordingly, in the area overlapping the first monitor pattern MP1, the end of the second defective organic layer OL" may not be monitored. Accordingly, a defect in the display device may be detected early.

Figure 16:
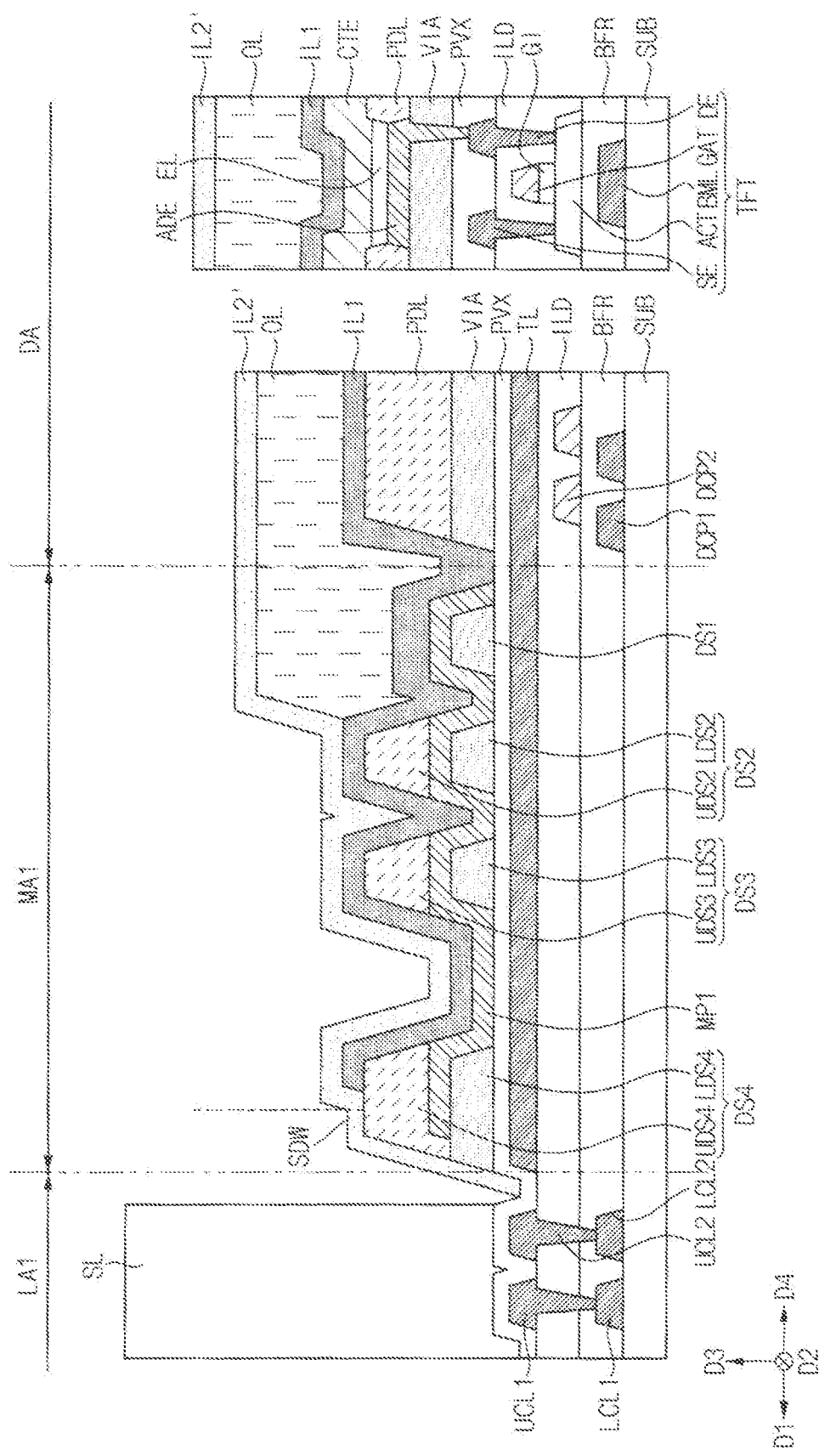
FIG. 16 is a cross-sectional view illustrating a case in which a shadow of a second inorganic layer included in the display device of FIG. 3 is formed.

FIG. 16 is a cross-sectional view illustrating a case in which a shadow of a second inorganic layer included in the display device of FIG. 3 is formed.

Referring to FIG. 16, a shadow SDW of the second defective inorganic layer IL2' may be formed. In this case, the second defective inorganic layer IL2' may completely overlap the first monitor pattern MP1. In other words, an end of the second defective inorganic layer IL2' may not be positioned on the first monitor pattern MP1. Accordingly, in the area overlapping the first monitor pattern MP1, the end of the second defective inorganic layer IL2' may not be monitored. Accordingly, a defect in the display device may be detected early.

The display device 1000 according to some embodiments of the present invention may include the electrically floated first monitor pattern MP1. The first monitor pattern MP1 may be positioned between the display area DA and the first line area LA1, and the area overlapping the first monitor pattern MP1 may be monitored using the first monitor pattern MP1. Accordingly, a defect in which the organic layer OL and/or the second inorganic layer IL2 overlaps the first line area LA1 may be detected early.

Although certain embodiments and implementations have been described herein, other embodiments and modifications will be apparent from this description. Accordingly, the inventive concepts are not limited to such embodiments, but rather are defined by the broader scope of the appended claims, and their equivalents, and various obvious modifications and equivalent arrangements as would be apparent to a person of ordinary skill in the art.

What is claimed is:

1. A display device comprising:
   a transistor on a substrate in a display area;
   at least one monitor pattern on the substrate in a monitor area adjacent to the display area and electrically floating; and
   an emission layer on the transistor.

2. The display device of claim 1, wherein the monitor pattern has an island shape.

3. The display device of claim 1, further comprising:
   a passivation layer under the monitor pattern, and
   wherein a contact hole is not defined in the passivation layer which contacts the monitor pattern.

4. The display device of claim 3, further comprising:
   lower structures between the monitor pattern and the passivation layer and spaced apart from each other, and
   wherein a contact hole is not defined in the lower structures which contact the monitor pattern.

5. The display device of claim 4, wherein the monitor pattern contacts an upper surface and a side surface of each of the lower structures.

6. The display device of claim 4, wherein the monitor pattern is arranged along a profile of the passivation layer and the lower structures.

7. The display device of claim 4, further comprising:
   a via insulating layer on the transistor and including a same organic material as the lower structures; and
   a first electrode between the via insulating layer and the emission layer, including a same material as the monitor pattern, and electrically connected to the transistor, and
   wherein the passivation layer overlaps the display area, and is between the transistor and the via insulating layer.

8. The display device of claim 1, further comprising:
   upper structures on the monitor pattern and spaced apart from each other, and
   wherein a contact hole is not defined in the upper structures which overlap the monitor pattern.

9. The display device of claim 8, wherein the monitor pattern overlapping the upper structures is not exposed.

10. The display device of claim 8, further comprising:
    a first inorganic layer on the monitor pattern and the upper structures, and
    wherein a contact hole is not defined in the first inorganic layer which contacts the monitor pattern.

11. The display device of claim 10, further comprising:
    a first electrode between the transistor and the emission layer, including a same material as the monitor pattern, and electrically connected to the transistor; and
    a pixel defining layer on the first electrode and including a same organic material as the upper structures, and
    wherein the first inorganic layer overlaps the display area and is on the pixel defining layer.

12. The display device of claim 1, further comprising:
a passivation layer under the monitor pattern;
lower structures between the passivation layer and the monitor pattern and spaced apart from each other;
upper structures on the monitor pattern and spaced apart from each other; and
a first inorganic layer on the monitor pattern and the upper structures, and
wherein the monitor pattern is completely covered by the passivation layer, the lower structures, the upper structures, and the first inorganic layer.

13. The display device of claim 1, further comprising:
an organic layer on the emission layer and the monitor pattern and overlapping the monitor pattern,
wherein the monitor area is adjacent to the display area in a first direction, and
wherein the monitor pattern further extends from the organic layer by a first margin distance in the first direction, in a plan view.

14. The display device of claim 13, further comprising:
a second inorganic layer on the organic layer and overlapping the monitor pattern, and
wherein the monitor pattern further extends from the second inorganic layer by a second margin distance in the first direction, in a plan view.

15. The display device of claim 14, wherein the first margin distance is greater than the second margin distance.

16. The display device of claim 1, wherein the monitor area is adjacent to the display area in a first direction, and wherein the monitor pattern includes a plurality of monitor patterns in a second direction intersecting the first direction.

17. The display device of claim 1, wherein the monitor area includes:
a first monitor area adjacent to the display area in a first direction; and
a second monitor area adjacent to the display area in a fourth direction opposite to the first direction, and
wherein the monitor pattern includes:
first monitor patterns arranged in a second direction intersecting the first direction in the first monitor area; and
second monitor patterns arranged in the second direction in the second monitor area.

18. The display device of claim 1, further comprising:
a clock line on the substrate in a line area adjacent to the monitor area,
wherein the monitor area is adjacent to the display area in a first direction, and
wherein the line area is adjacent to the monitor area in the first direction.

19. The display device of claim 1, wherein the monitor pattern includes at least one selected from a group consisting of a metal, an alloy, a conductive metal oxide, and a transparent conductive material.

* * * * *